(12) United States Patent
Chirko et al.

(10) Patent No.: US 9,448,253 B2
(45) Date of Patent: Sep. 20, 2016

(54) DETERMINING A STATE OF A HIGH ASPECT RATIO HOLE USING MEASUREMENT RESULTS FROM AN ELECTROSTATIC MEASUREMENT DEVICE

(71) Applicant: Applied Materials Israel, Ltd., Rehovot (IL)

(72) Inventors: Konstantin Chirko, Rehovot (IL); Alon Litman, Nes Ziona (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 14/719,193

(22) Filed: May 21, 2015

(65) Prior Publication Data

US 2015/0362524 A1    Dec. 17, 2015

Related U.S. Application Data

(60) Provisional application No. 62/011,464, filed on Jun. 12, 2014.

(51) Int. Cl.
| | |
|---|---|
| *H01J 37/00* | (2006.01) |
| *G01Q 60/30* | (2010.01) |
| *G01Q 30/02* | (2010.01) |
| *H01J 37/28* | (2006.01) |

(52) U.S. Cl.
CPC .............. *G01Q 60/30* (2013.01); *G01Q 30/02* (2013.01); *H01J 37/28* (2013.01); *H01J 2237/281* (2013.01); *H01J 2237/2815* (2013.01)

(58) Field of Classification Search
USPC .......................................... 250/492.3; 850/36
See application file for complete search history.

(56) References Cited

U.S. PATENT DOCUMENTS

| | | | | |
|---|---|---|---|---|
| 5,412,210 | A * | 5/1995 | Todokoro ............... | G01B 15/04 250/306 |
| 5,723,981 | A * | 3/1998 | Hellemans ............ | B82Y 35/00 257/E21.531 |
| 7,861,577 | B2 * | 1/2011 | Shigeno ................ | B82Y 35/00 73/105 |
| 8,839,461 | B2 * | 9/2014 | Fukuma ................ | B82Y 35/00 250/306 |

* cited by examiner

*Primary Examiner* — Phillip A Johnston
(74) *Attorney, Agent, or Firm* — Kilpatrick Townsend & Stockton LLP

(57) ABSTRACT

A system, method and a non-transitory compute readable medium for evaluating a high aspect ratio (HAR) hole having a nanometric scale width and formed in a substrate, including obtaining, during an illumination period, multiple measurement results by an electrostatic measurement device that comprises a probe tip that is placed in proximity to the HAR hole; wherein multiple locations within the HAR hole are illuminated with a beam of charged particles during the illumination period; and processing the multiple measurement results to determine a state of the HAR hole.

17 Claims, 11 Drawing Sheets

DETERMINING A STATE OF A HIGH ASPECT RATIO HOLE USING MEASUREMENT RESULTS FROM AN ELECTROSTATIC MEASUREMENT DEVICE

CROSS-REFERENCE TO RELATED APPLICATIONS

This application claims priority to U.S. Provisional Application No. 62/011,464, filed Jun. 12, 2014, the entire contents of which are incorporated herein by reference in their entirety for all purposes.

BACKGROUND

Modern three dimensional memory arrays (such as vertical NAND flash memory devices) include a stack of at least one pair of isolating and conductive layers. Sequences of flash memory cells are connected to each other by vertical bitlines. A vertical bitline is manufactured by forming a high aspect ratio (HAR) hole in the isolating and conductive layers and then filling the HAR hole with a conductive material.

The HAR hole may exhibit a high aspect ratio (ratio between the width of the HAR hole and its depth) of 1:30-1:100.

The HAR hole has a nanometric scale cross section (diameter of nanometers) and its bottom cannot be properly imaged by an optical tools. In most cases electron beam imaging of the bottom of the HAR hole is not possible as the electrons that impinge on the bottom of the HAR hole do not manage to exit the HAR hole and be detected by an electron detector and thus the image of the HAR hole does not include sufficient information.

There is a growing need to evaluate HAR holes of nanometric scale.

SUMMARY

A method, system, and non-transitory computer readable medium are provided for determining a state of a HAR hole.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
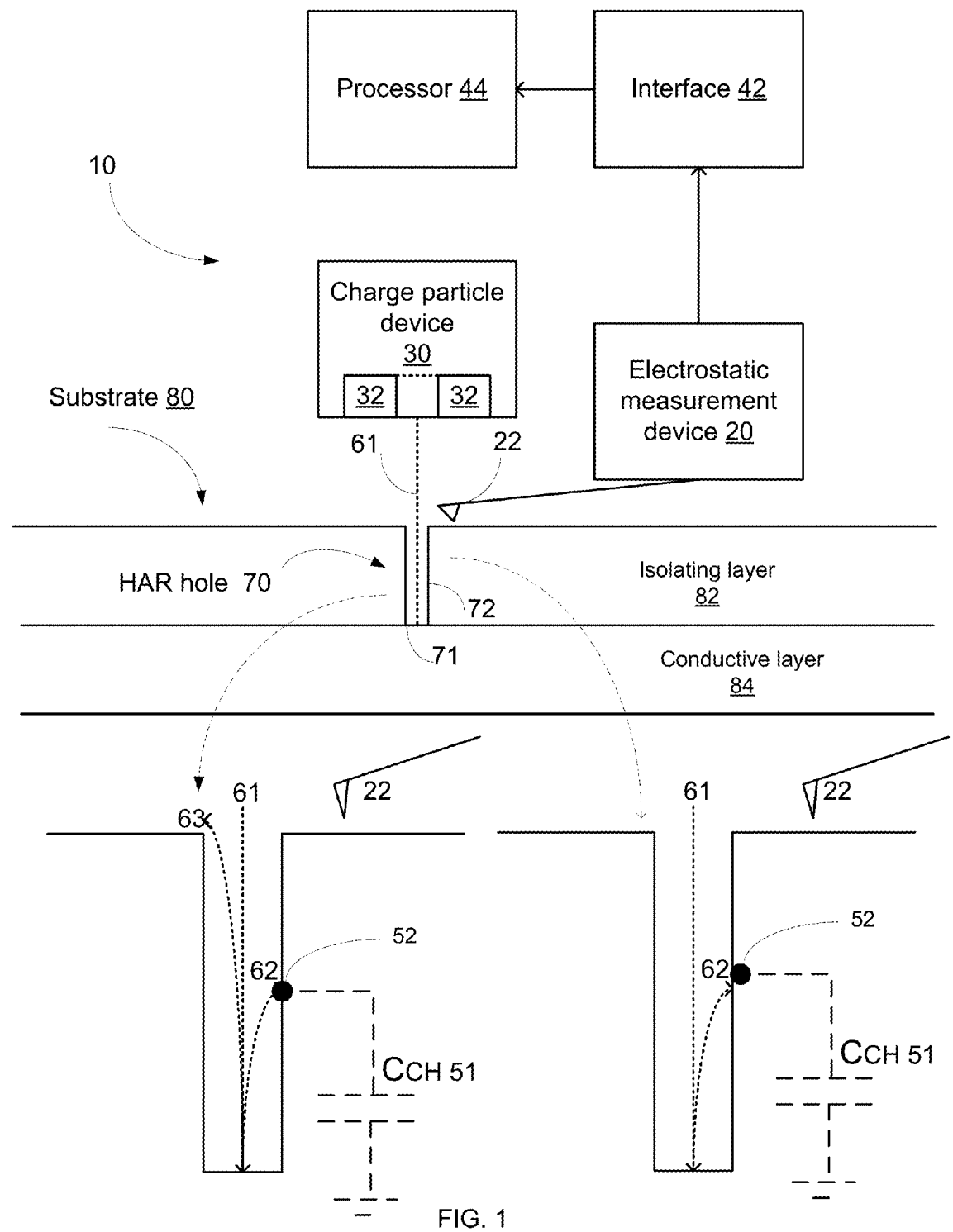
FIG. 1 illustrates a system and a substrate according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to any system capable of executing the method and should be applied mutatis mutandis to any non-transitory computer readable medium that stores instructions that once executed by a computer result in the execution of the method.

Any reference in the specification to a system should be applied mutatis mutandis to any method that may be executed by the system and should be applied mutatis mutandis to any non-transitory computer readable medium that stores instructions that may be executed by the system.

Any reference in the specification to a non-transitory computer readable medium should be applied mutatis mutandis to any system capable of executing the instructions stored in the non-transitory computer readable medium and should be applied mutatis mutandis to any method that may be executed by a computer that reads the instructions stored in the non-transitory computer readable medium.

According to an embodiment of the invention there is provided a system, method and a non-transitory computer readable medium for evaluating a high aspect ratio (HAR) hole having a nanometric scale width and formed in a substrate.

FIG. 1 illustrates a system 10 and a substrate 80 according to an embodiment of the invention.

Substrate 80 may include multiple isolating and conductive layers but is illustrated as including an isolating layer 82 that is formed on top of a conductive layer 84. The HAR hole 70 is expected to penetrate the isolating layer 82 and have a bottom 71 at the conductive layer 84. The HAR hole 70 has sidewalls such as sidewall 72.

FIG. 1 illustrates system 10 as including (a) a charged particle device 30 such as a scanning electron microscope (SEM), (b) an electrostatic measurement device 20 such as a Kelvin probe force microscope (probes a potential difference between the probe tip and a point of interest) or an electrostatic force microscope (probes the electrostatic force applied on a probe tip), (c) an interface 42 for receiving measurement signals from the electrostatic measurement device 20 and (d) a processor 44.

It is noted that the interface 42 can be a communication port, a memory module and the like. The processor 44 can belong to the charged particle device 30 or may not belong to the charged particle device.

According to an embodiment of the invention the system 10 includes an interface 42 and a processor 44 and receives measurement signals from the electrostatic device 20 without including the charged particle device 30 and/or the electrostatic measurement device 20.

For simplicity of explanation it is assumed that the charged particles are electrons although ions can be used.

The interface 42 may be arranged to obtain, during an illumination period, multiple measurement results generated by electrostatic measurement device 20 that may include a probe tip 22 that is placed in proximity to the HAR hole 70. The term proximity can be one or more tenths of nanometer, one or more hundreds of nanometer, one or more microns, one or more tens of a micron, one or more hundreds of a micron, one or more millimeters, one or more tens of a millimeter, one or more hundreds of a millimeters, one or more centimeters and the like. The term proximity may also mean close enough to be affected from the charging of the HAR bottom and/or HAR hole sidewalls.

The illumination period is a period during which multiple locations (also referred to as pixels) within the HAR hole 70 are illuminated with a beam of charged particles such as electron beam 61.

Figure 2:
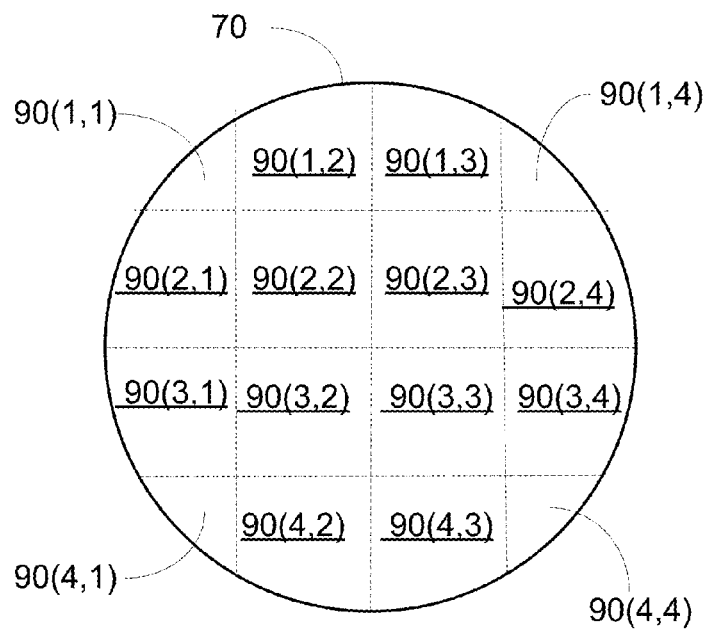
FIG. 2 illustrates a scan pattern of the HAR hole and multiple locations within the HAR hole according to an embodiment of the invention.
Figure 2:
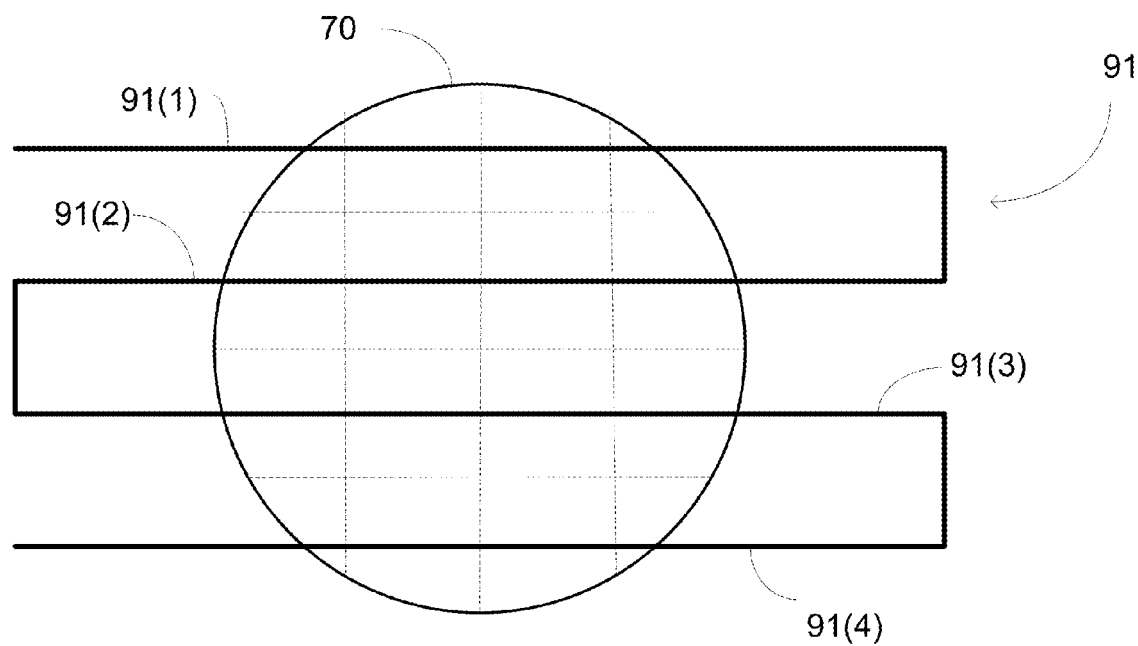

FIG. 2 illustrates pixels 90(1,1)-90(4,4) of a sixteen pixel array although the number of pixels per HAR hole can differ from sixteen and depend on the size and shape of the HAR hole 70, the size and shape of the cross section of the electron beam 61, scanning patterns and the like. FIG. 2 also illustrates a raster scan pattern 91 that has four parallel scan lines 91(1)-91(4)—one scan line per each row of pixels our of pixels 90(1,1)-90(4,4). Other scan patterns can be provided (for example—a spiral pattern, a random or pseudo-random scan pattern). Furthermore—the multiple locations can be irradiated without following a scan pattern. These multiple locations can be irradiated by a continuous charged particle beam or by a pulses charged particle beam.

Referring back to FIG. 1—the processor 44 may be arranged to process the multiple measurement results to determine a state of the HAR hole 70. The state of the HAR hole 70 may include its depth (for example—did its bottom reach the desired depth), the composition of materials at the HAR hole (for example its bottom)—whether the HAR hole 70 includes defects such as excessive conductive or insulating materials, the charging regime near the HAR hole 70 and the like. The stage of the HAR hole 70 can be reflected by the current that may flow through one of more layers of the substrate, from the yield of electrons that either manage to exit the HAR hole 70 and be detected by detector 32 of charge particle device or electrons that charge isolating layer 82.

The bottom part of FIG. 1 illustrates two scenarios
 a. The left scenario illustrates electron beam 61 that illuminates the HAR hole 70 (and especially the bottom of HAR hole 70), and results in the emission of electrons such as (a) electrons (not shown) that are emitted from the bottom but return to the bottom of the HAR hole, (b) electrons 62 (such as secondary electrons) that impinge on the sidewall 72 of HAR hole and charge it (this is represented by charge 52), and (c) electrons 63 (such as secondary electrons) that manage to exit the HAR hole 70.
 b. The right scenario illustrates electron beam 61 that illuminates the HAR hole 70 (and especially the bottom of HAR hole 70), and results in the emission of electrons such as (a) electrons (not shown) that are emitted from the bottom but return to the bottom of the HAR hole, and (b) electrons 62 (such as secondary electrons) that impinge on the sidewall 72 of HAR hole and charge it (this is represented by charge 52).

The electrons that impinge on the sidewall of HAR hole 70 charge isolating layers such as isolating layer 82. FIG. 1 includes a dot 62 that represents the charge and the capacitance between the impingement point and the conductive layer 84 is illustrated by capacitor $C_{CH}$ 51.

The force sensed by probe tip 22 or the potential difference sensed by probe tip 22 is affected by charge 52.

The electrostatic measurement device 20 generates measurement signals that are indicative of the charge and the changes of these measurement signals over time (for example during an illumination period, during multiple illumination periods, during a fraction of an illumination period) may be indicative of changes in the potential of the HAR hole 70, changes in the current that may flow through the isolating layer 82, and the like.

Figure 3:
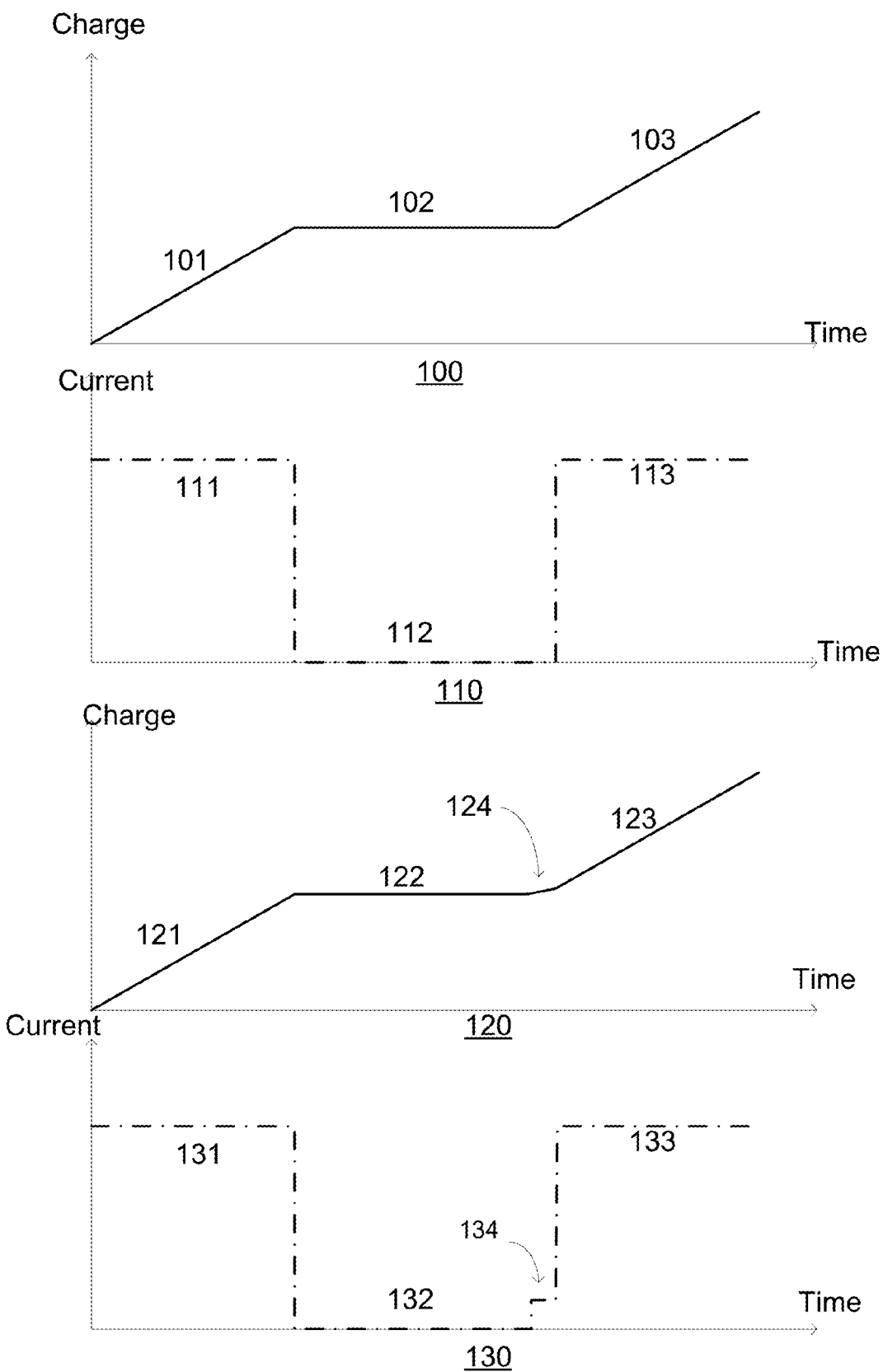
FIG. 3 illustrates measurement signals obtained from a single scan line of the scan patters of FIG. 2 of different HAR holes according to an embodiment of the invention.

FIG. 3 includes four graphs—100, 110, 120 and 130.

Graph 100 illustrates a first example of a change of charge across scan line 92(2) of FIG. 2—it starts by a sloped line 101 (scanning the isolating layer that delimits the HAR hole 70), is followed by a horizontal line 102 (indicative of a scan of a flat bottom 71 that is made of conductive material) and is followed by another sloped line 103 (scanning the isolating layer that delimits the HAR hole 70).

Graph 110 is indicative of a derivative of graph 100—it includes lines 111 and 113 that represent the surface of isolating layer 82 and bottom line 112 that is lower than lines 111 and 113 and is positioned between these lines. Bottom line 112 represents the bottom of HAR line 70.

Graph 120 illustrates a second example of a change of charge across scan line 92(2) of FIG. 2—it starts by a sloped line 121 (scanning the isolating layer that delimits the HAR hole 70), is followed by a horizontal line 122 (indicative of a scan of a flat bottom 71 that is made of conductive material), is followed by an additional sloped line 124 and ends with yet another sloped line 123 (scanning the isolating layer that delimits the HAR hole 70). The yet another sloped line 123 is steeper than additional sloped line 124—and the additional sloped line 124 is indicative of a defect—a small step (denoted 134 in graph 130) formed at the bottom of the HAR hole.

Graph 130 is indicative of a derivative of graph 120—it includes lines 131 and 133 that represent the surface of isolating layer 82, bottom line 132 and additional line 134 that represent a step (defect) formed at the bottom of the HAR hole.

Figure 4:
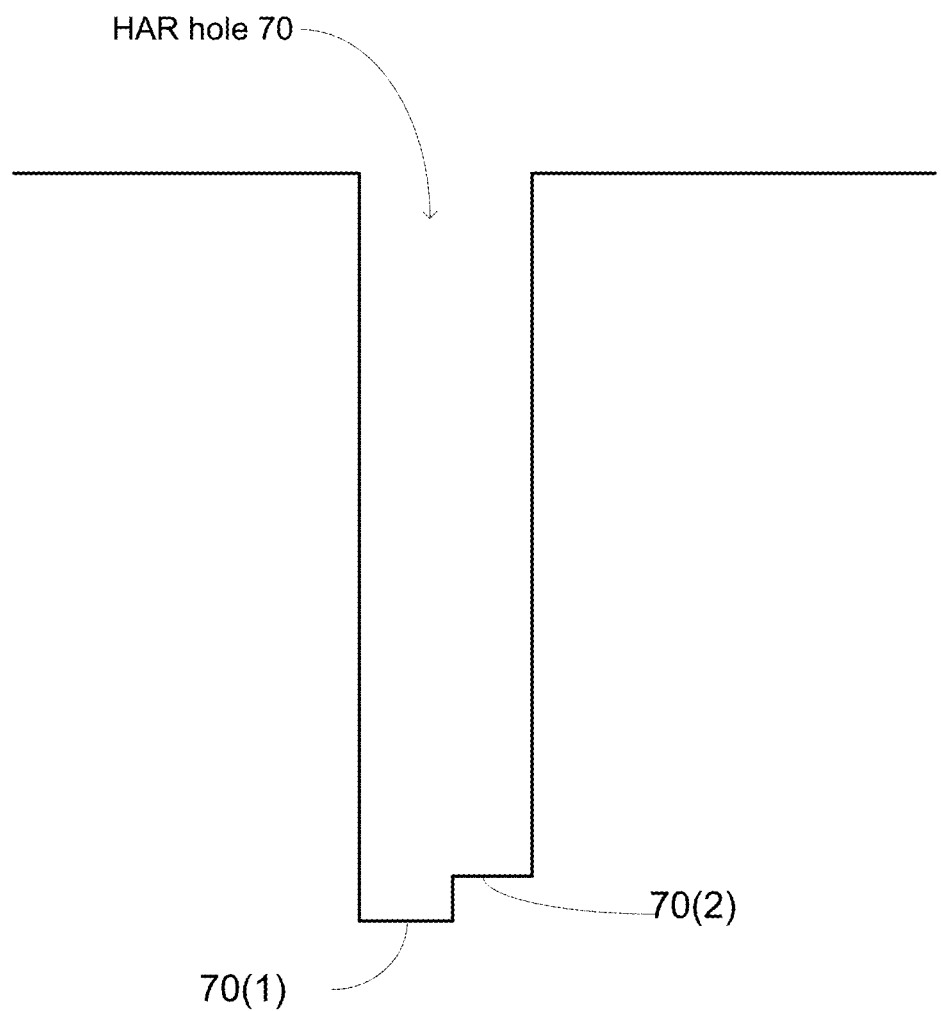
FIG. 4 illustrates a HAR hole according to an embodiment of the invention.

FIG. 4 illustrates HAR hole 70 that its bottom includes one half 70(1) and second half 70(2) that differ from each other by yield—due to a deposition of matter at the right side of HAR hole 70.

FIGS. 5-10 illustrate various simulated results of scanning HAR hole 70 of FIG. 4 according to an embodiment of the invention. FIGS. 5-10 represent simulated values of the following parameters:
 a. Itotal—the current that represents the flow of electrons of charge electron beam 61. It can be calculated from the parameters of the charged particle beam, the duration of illumination period and the like.
 b. Iwall—the current that flows through the isolating layer—through capacitor $C_{CH}$ 51. It can be calculated from the measurement results.

c. Ibottom—the current that flows through the conductive layer 84. Can be calculated as the difference between Itotal and Iwall.

d. Vch—the voltage that develops on C$_{CH}$ 51.

e. Vch derivative—the derivative of Vch.

Figure 5:
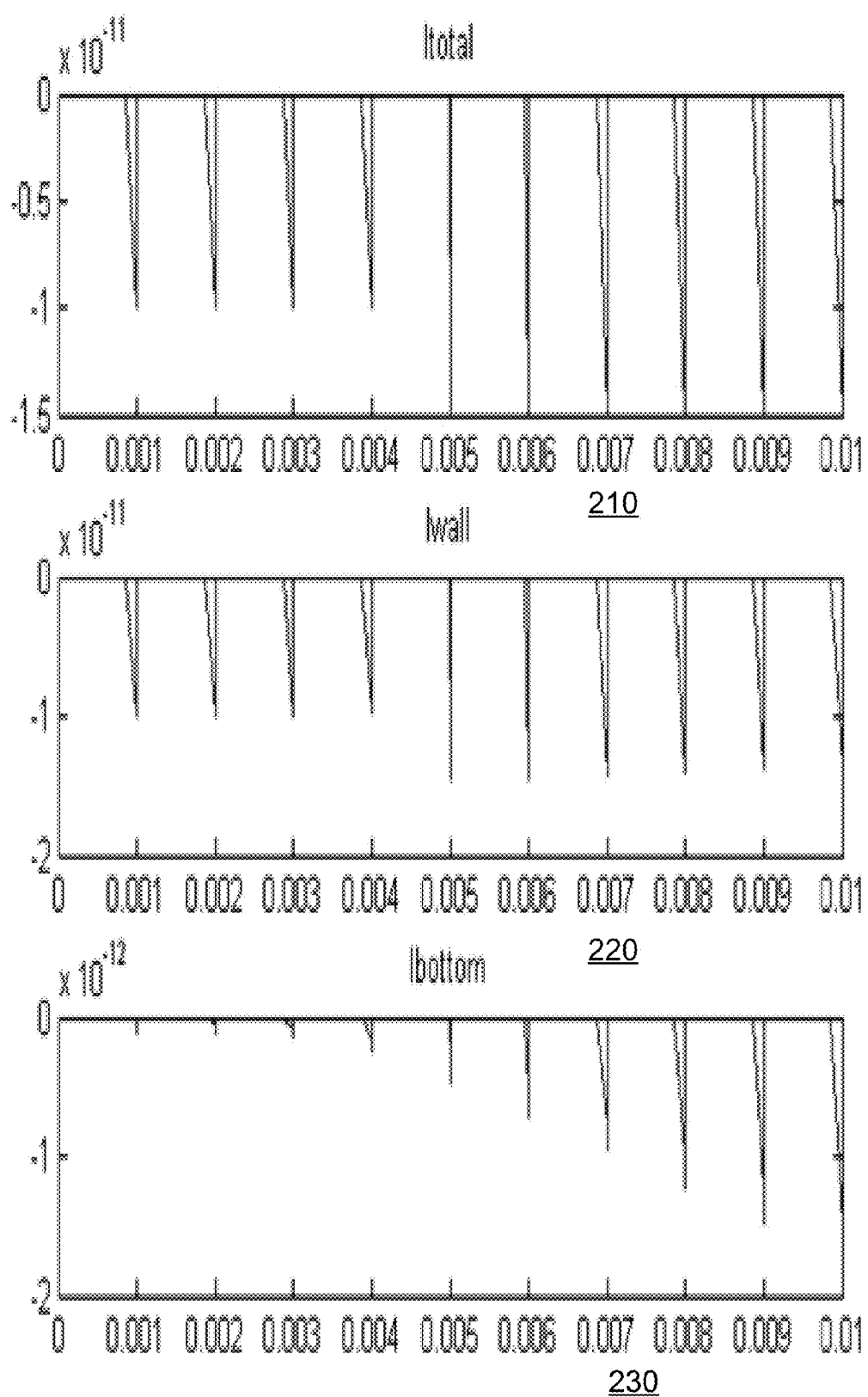
FIGS. 5-10 illustrate simulated currents and HAR hole voltage according to various embodiments of the invention.
Figure 6:
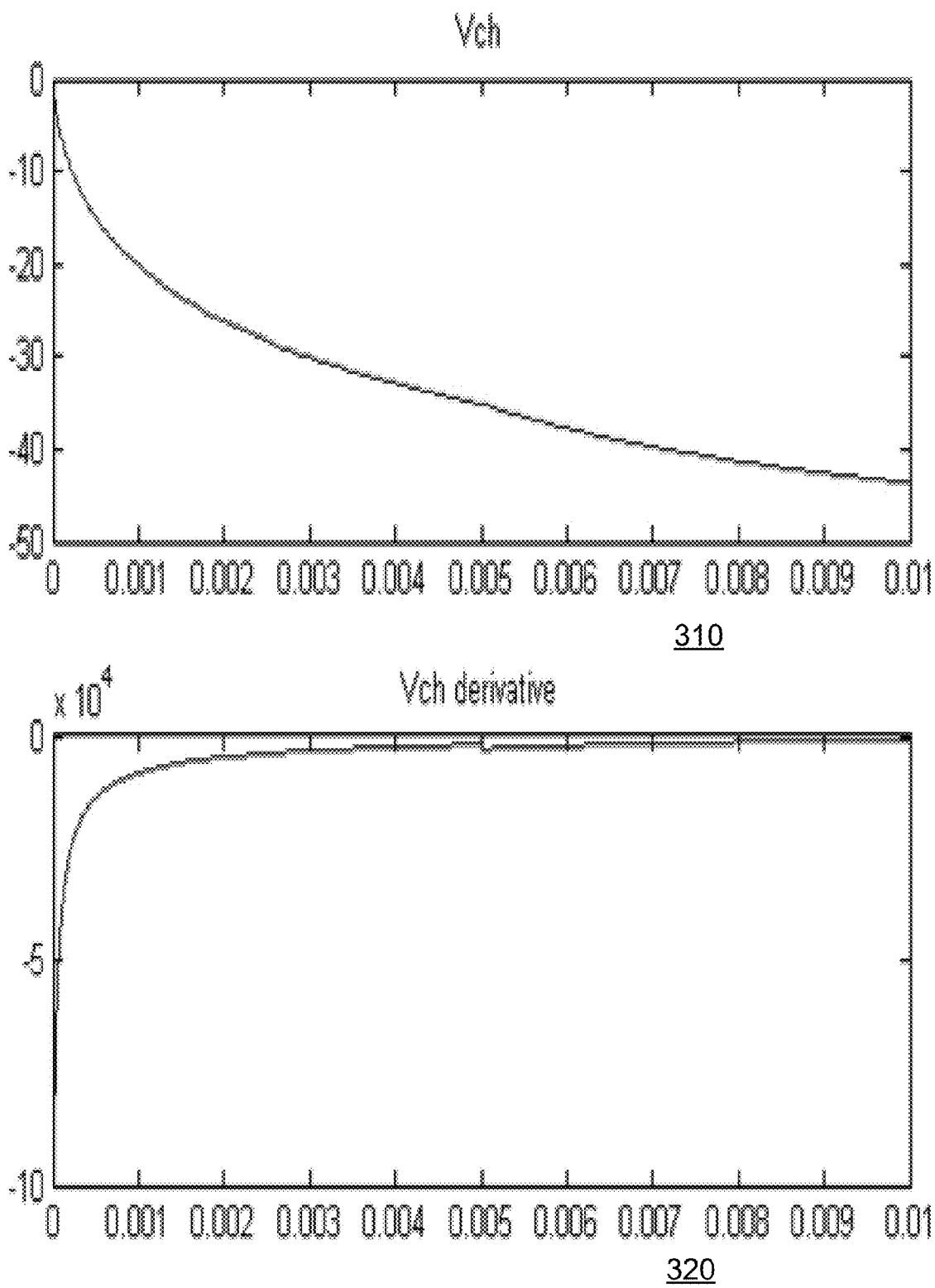
Figure 7:
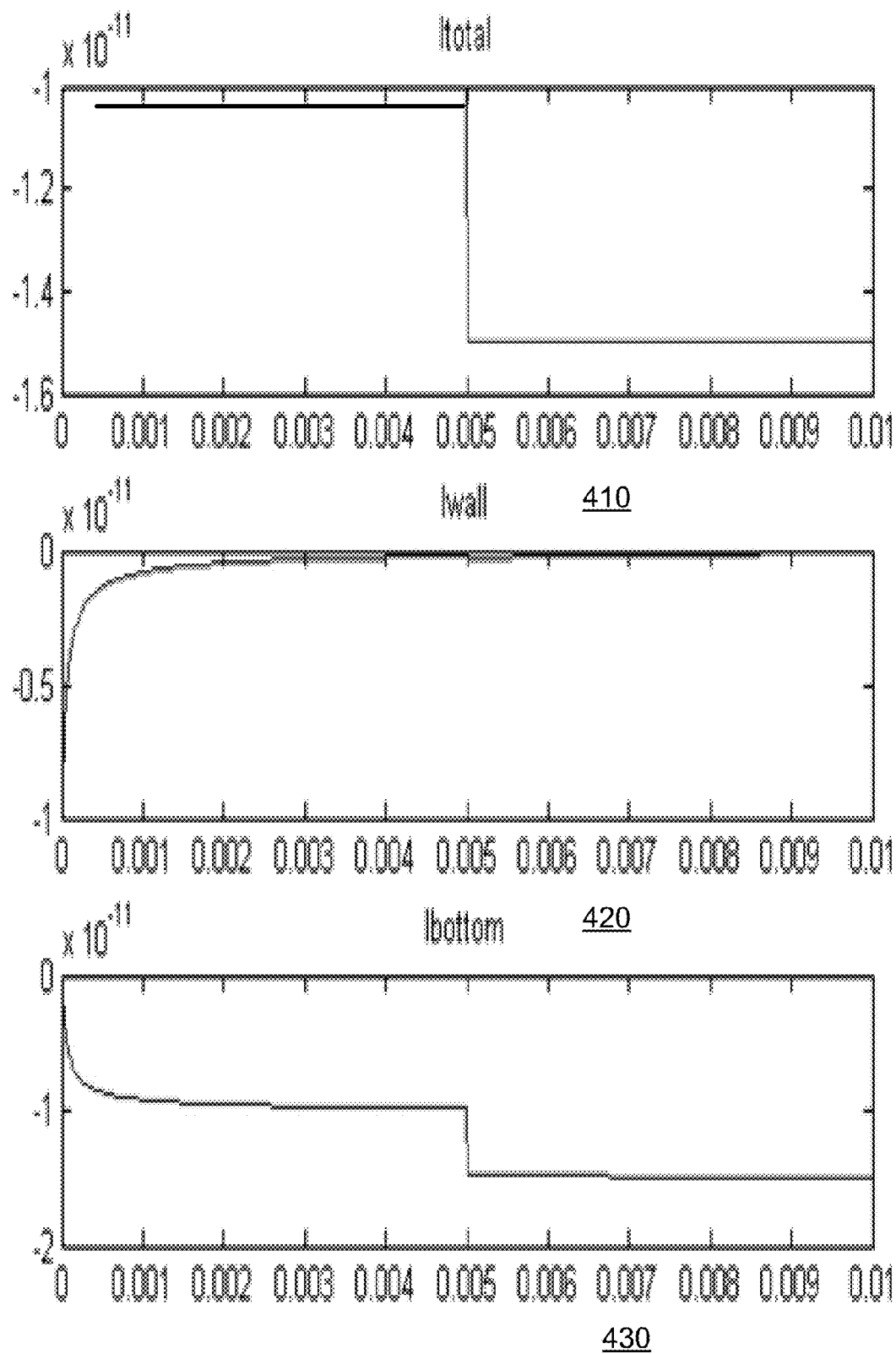
Figure 8:
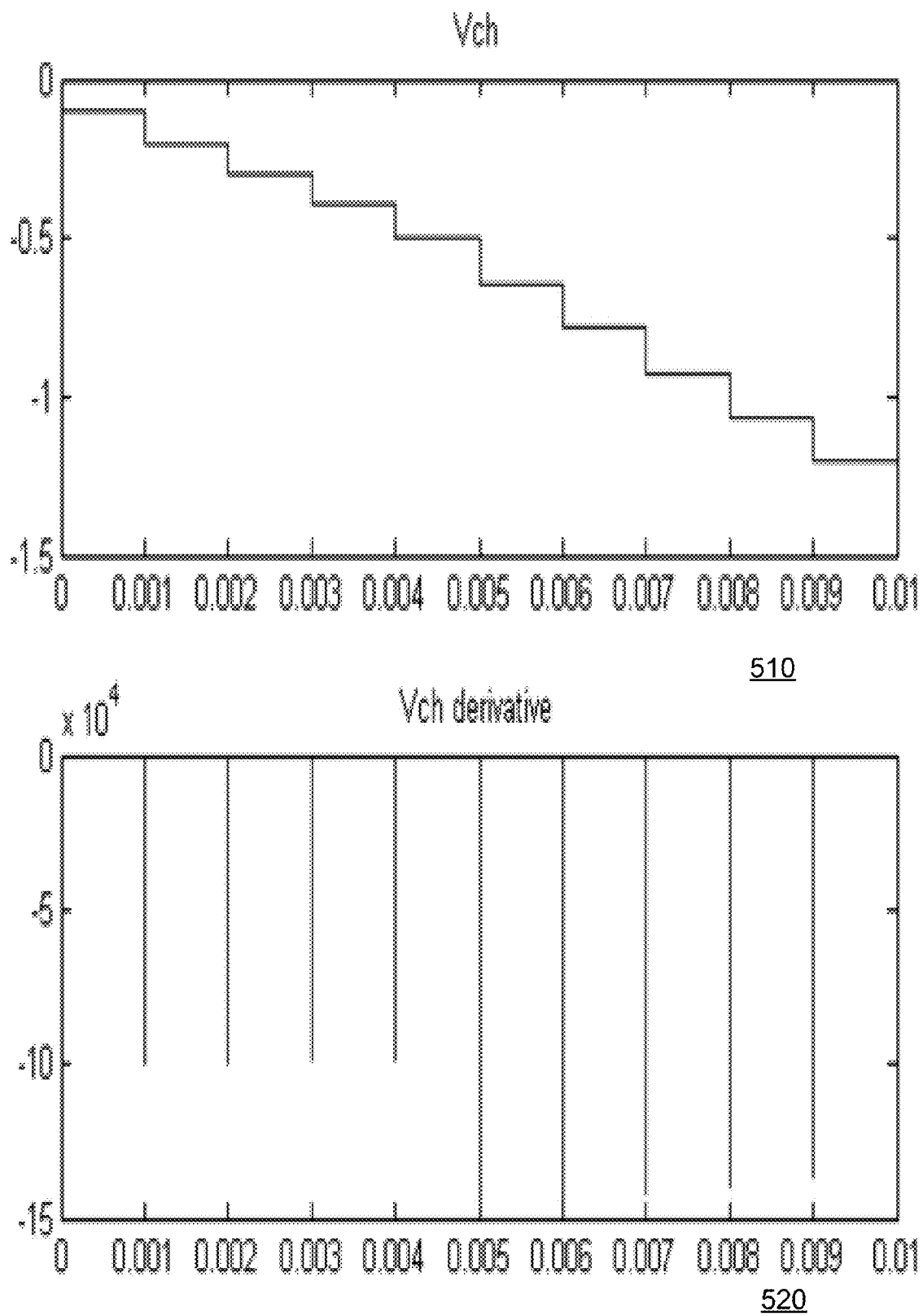
Figure 9:
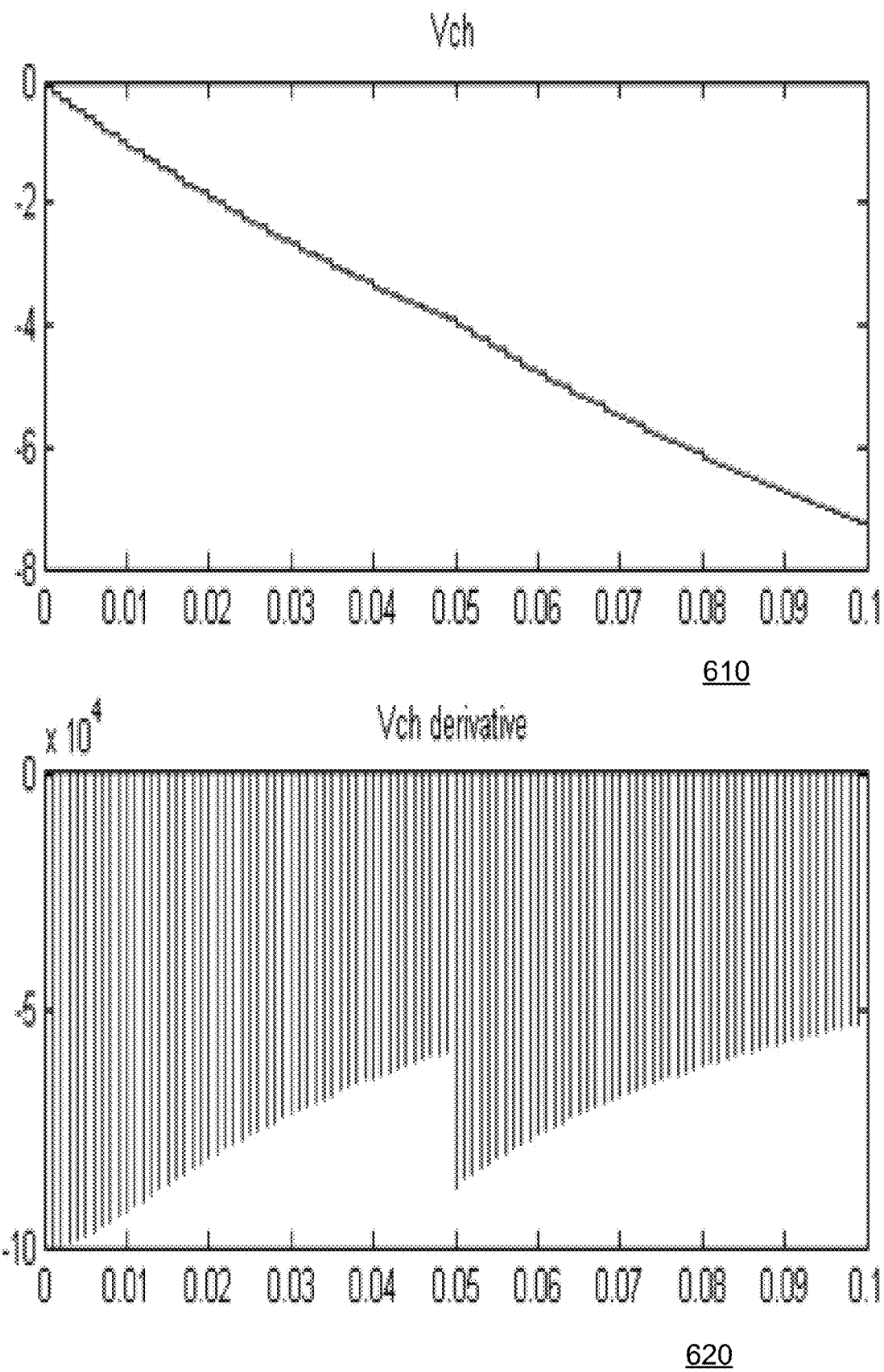
Figure 10:
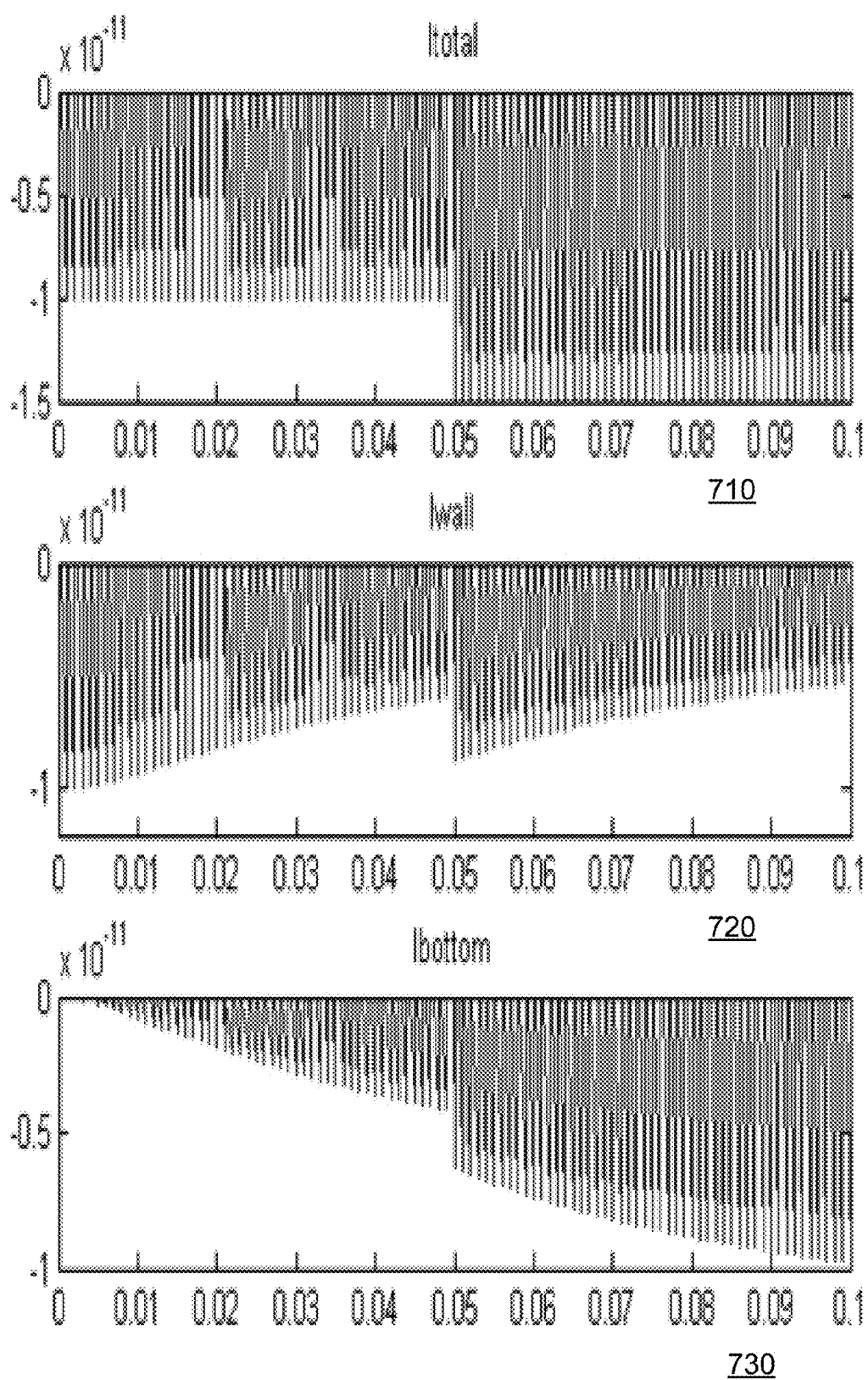

Graphs 210, 220 and 230 of FIG. 5, graphs 310 and 320 of FIG. 6 and graphs 410, 420 and 430 of FIG. 7 represent a scan of HAR hole 70 with a continuous electron beam while graphs 510, 520 of FIG. 8, graphs 610 and 620 of FIG. 9 and graphs 710, 720 and 730 of FIG. 10 represent a scan of HAR hole 70 with a non-continuous (pulsed) electron beam 61.

The measurement results may be indicative of at least one out of a potential offset between the probe tip and at least one portion of a wall of the HAR hole; and an electrostatic force applied on the probe tip and the processor 44 may be arranged to calculate a change of the potential offset over time.

The processor 44 may be arranged to determine that the HAR hole is of an acceptable state if the change of the potential offset over time matches an acceptable change of potential offset over time.

The processor 44 may be arranged to determine that the HAR hole is of an undesirable state if a rate of change of the potential offset over time differs by at least a predetermined amount from an acceptable change of potential offset over time. The charging rate of CCH 51 may be indicative of the depth of the HAR hole—shorter holes may be represented by smaller capacitors—and higher charge rate of the isolating layer.

The processor 44 may be arranged to determine that the HAR hole bottom failed to reach a target conductive layer and is formed in an isolating layer if a change of the potential offset over time is faster by at least a predetermined amount from a desired change of potential offset over time. This is reflected by changes in the capacitance CCH.

The processor 44 may be arranged to determine that at least one of a shape of a bottom of the HAR hole and a material composition of the bottom of the HAR hole differs from an allowable shape and an allowable material composition respectively if a shape of a curve representative of a change of the potential offset over time differs by at least a predetermined shape factor from an acceptable change of potential offset over time.

The processor 44 may be arranged to determine whether at least a minimal desired amount of electrons exited the HAR hole during the illumination period. This may be illustrated, for example in the first scenario of FIG. 1.

Processor 44 may be arranged to determine to process the multiple measurement results to determine the state of the HAR hole if the less than the minimal desired amount of electrons exited the HAR hole during the illumination period.

The processor 44 may be arranged to attempt to generate an image of the bottom of the HAR hole from at least zero electrons that exited the HAR hole during the illumination period. These electrons (63) may be detected by detector 32 to form a SEM image of the bottom of the HAR hole 70.

The processor 44 may be arranged to determine the state of the HAR hole in response to the image of the bottom of the HAR hole and the multiple measurement results.

The processor 44 may be arranged to determine the state of the HAR hole in response to the image of the bottom of the HAR hole if the image of the bottom of the HAR hole conveys at least a minimal amount of information relating to the bottom of the HAR hole.

Figure 11:
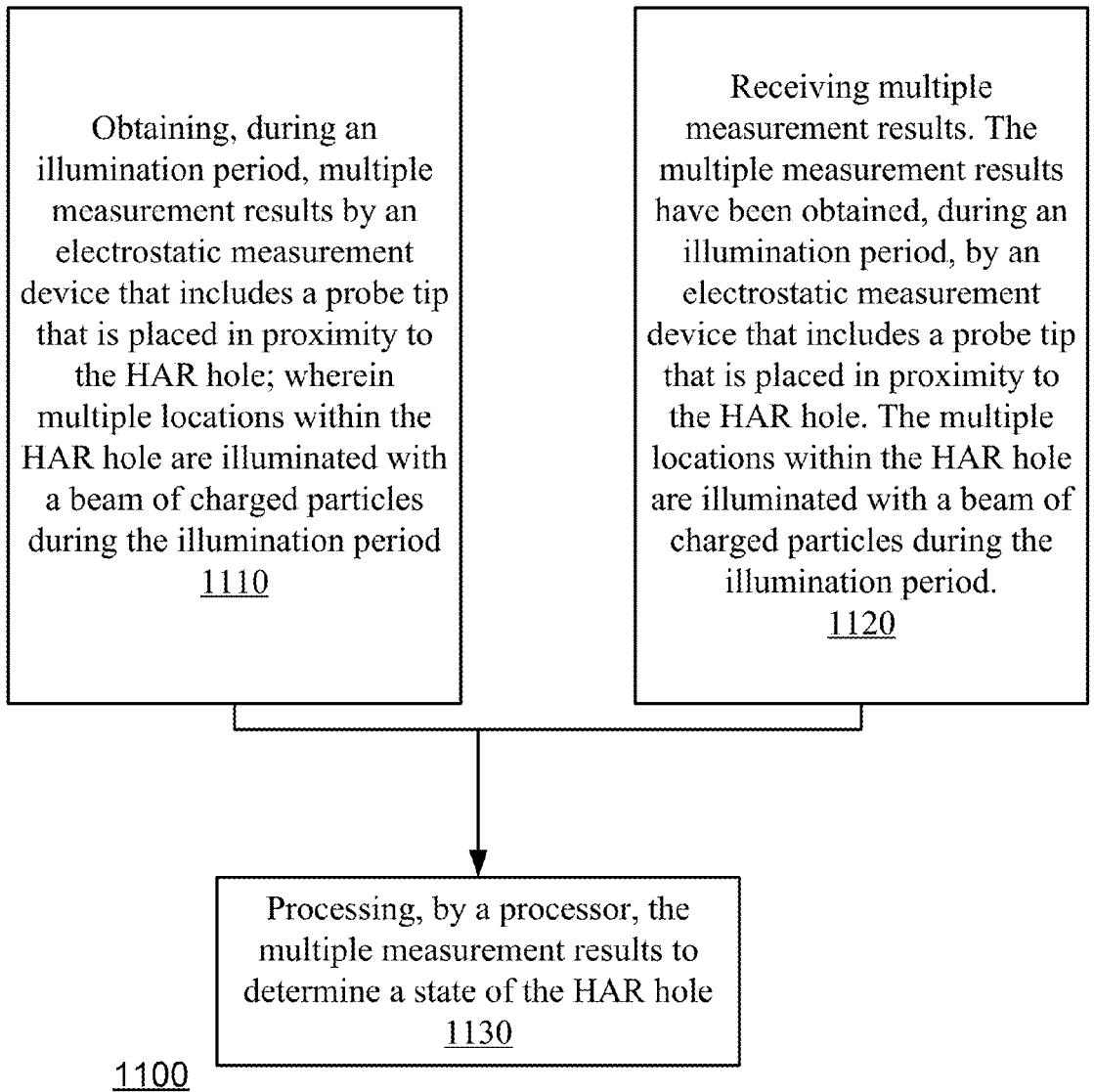
FIG. 11 illustrates a method according to an embodiment of the invention.

FIG. 11 illustrates method 1100 according to an embodiment of the invention.

Method 1100 is for evaluating a high aspect ratio (HAR) hole having a nanometric scale width and formed in a substrate.

Method 1100 may start by stage 1110 or by stage 1120.

Stage 1100 may include obtaining, during an illumination period, multiple measurement results by an electrostatic measurement device that includes a probe tip that is placed in proximity to the HAR hole; wherein multiple locations within the HAR hole are illuminated with a beam of charged particles during the illumination period.

Stage 1110 may include illuminating multiple locations within the HAR hole with a beam of charged particles during the illumination period.

Stage 1100 may include illuminating the HAR hole by scanning the HAR hole with a continuous beam of electrons.

Stage 1100 may include illuminating the HAR hole by scanning the HAR hole with a pulsed beam of electrons.

Stage 1120 may include receiving multiple measurement results. The multiple measurement results have been obtained, during an illumination period, by an electrostatic measurement device that includes a probe tip that is placed in proximity to the HAR hole. The multiple locations within the HAR hole are illuminated with a beam of charged particles during the illumination period.

Stages 1110 and 1120 may be followed by stage 1130 of processing, by a processor, the multiple measurement results to determine a state of the HAR hole.

The measurement results may be indicative of at least one out of a potential offset between the probe tip and at least one portion of a wall of the HAR hole and an electrostatic force applied on the probe tip.

Stage 1130 may include calculating a change of the potential offset over time.

Stage 1130 may include determining that the HAR hole is of an acceptable state if the change of the potential offset over time matches an acceptable change of potential offset over time.

Stage 1130 may include determining that the HAR hole is of an undesirable state if a rate of change of the potential offset over time differs by at least a predetermined amount from an acceptable change of potential offset over time.

Stage 1130 may include determining that the HAR hole bottom failed to reach a target conductive layer and is formed in a isolating layer if a change of the potential offset over time is faster by at least a predetermined amount from a desired change of potential offset over time.

Stage 1130 may include determining that at least one of a shape of a bottom of the HAR hole and a material composition of the bottom of the HAR hole differs from an allowable shape and an allowable material composition respectively if a shape of a curve representative of a change of the potential offset over time differs by at least a predetermined shape factor from an acceptable change of potential offset over time.

The method wherein the probe tip is located at a microscopic scale distance from the HAR hole.

Stage 1130 may include determining whether at least a minimal desired amount of electrons exited the HAR hole during the illumination period; and determining to process the multiple measurement results to determine the state of the HAR hole if the less than the minimal desired amount of electrons exited the HAR hole during the illumination period.

Stage 1130 may include attempting to generate an image of the bottom of the HAR hole from at least zero electrons that exited the HAR hole during the illumination period.

Stage 1130 may include determining the state of the HAR hole in response to the image of the bottom of the HAR hole and the multiple measurement results.

Stage 1130 may include determining the state of the HAR hole in response to the image of the bottom of the HAR hole if the image of the bottom of the HAR hole conveys at least a minimal amount of information relating to the bottom of the HAR hole.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for evaluating a high aspect ratio (HAR) hole having a nanometric scale width and formed in a substrate, the method comprises:
    obtaining, during an illumination period, multiple measurement results by an electrostatic measurement device that comprises a probe tip that is placed in proximity to the HAR hole; wherein multiple locations within the HAR hole are illuminated with a beam of charged particles during the illumination period; and
    processing, by a processor, the multiple measurement results to determine a state of the HAR hole based upon calculating a change of a potential offset over time.

2. The method according to claim 1, wherein the measurement results are indicative of at least one of the potential offset between the probe tip and at least one portion of a wall of the HAR hole; and an electrostatic force applied on the probe tip.

3. The method according to claim 1, wherein the probe tip is located at a microscopic scale distance from the HAR hole.

4. The method according to claim 1, comprising illuminating multiple locations within the HAR hole with a beam of charged particles during the illumination period.

5. The method according to claim 1, comprising determining whether at least a minimal desired amount of electrons exited the HAR hole during the illumination period; and determining to process the multiple measurement results to determine the state of the HAR hole if less than the minimal desired amount of electrons exited the HAR hole during the illumination period.

6. The method according to claim 1, comprising attempting to generate an image of the bottom of the HAR hole from at least zero electrons that exited the HAR hole during the illumination period.

7. A non-transitory computer readable medium that stores instructions for:
    obtaining, during an illumination period, multiple measurement results by an electrostatic measurement device that comprises a probe tip that is placed in proximity to a high aspect ratio (HAR) hole, wherein multiple locations within the HAR hole are illuminated with a beam of charged particles during the illumination period; wherein the HAR hole has a nanometric scale width and is formed in a substrate; and
    processing the multiple measurement results to determine a state of the HAR hole based upon calculating a change of a potential offset over time.

8. The non-transitory computer readable medium according to claim 7 wherein the measurement results are indicative of at least one of the potential offset between the probe tip and at least one portion of a wall of the HAR hole; and an electrostatic force applied on the probe tip.

9. The non-transitory computer readable medium according to claim 7 that stores instructions for illuminating multiple locations within the HAR hole with a beam of charged particles during the illumination period.

10. The non-transitory computer readable medium according to claim 7 that stores instructions for locating the probe tip at a microscopic scale distance from the HAR hole.

11. The non-transitory computer readable medium according to claim 7 that stores instructions for determining whether at least a minimal desired amount of electrons exited the HAR hole during the illumination period; and determining to process the multiple measurement results to determine the state of the HAR hole if less than the minimal desired amount of electrons exited the HAR hole during the illumination period.

12. The non-transitory computer readable medium according to claim 7 that stores instructions for attempting to generate an image of the bottom of the HAR hole from at least zero electrons that exited the HAR hole during the illumination period.

13. A system for evaluating a high aspect ratio (HAR) hole having a nanometric scale width and formed in a substrate, the system comprises:

an interface that is arranged to obtain, during an illumination period, multiple measurement results obtained by an electrostatic measurement device that comprises a probe tip that is placed in proximity to the HAR hole; wherein multiple locations within the HAR hole are illuminated with a beam of charged particles during the illumination period; and a processor that is arranged to process the multiple measurement results to determine a state of the HAR hole based upon calculating a change of a potential offset over time.

14. The system according to claim 13, further comprising the electrostatic measurement device and wherein the measurement results are indicative of at least one of the potential offset between the probe tip and at least one portion of a wall of the HAR hole; and an electrostatic force applied on the probe tip.

15. The system according to claim 13, comprising a charge particle device that is arranged to illuminate multiple locations within the HAR hole with a beam of charged particles during the illumination period.

16. The system according to claim 13, wherein the processor is configured to determine whether at least a minimal desired amount of electrons exited the HAR hole during the illumination period; and determine to process the multiple measurement results to determine the state of the HAR hole if less than the minimal desired amount of electrons exited the HAR hole during the illumination period.

17. The system according to claim 13, wherein the processor is configured to attempt to generate an image of the bottom of the HAR hole from at least zero electrons that exited the HAR hole during the illumination period.

* * * * *